(12) United States Patent
Niikura

(10) Patent No.: US 10,833,672 B2
(45) Date of Patent: Nov. 10, 2020

(54) DRIVING CIRCUIT FOR HIGH-SIDE TRANSISTOR, SWITCHING CIRCUIT, AND CONTROLLER FOR DC/DC CONVERTER

(71) Applicant: ROHM CO., LTD., Kyoto (JP)

(72) Inventor: Hiroki Niikura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/682,313

(22) Filed: Nov. 13, 2019

(65) Prior Publication Data

US 2020/0162074 A1 May 21, 2020

(30) Foreign Application Priority Data

Nov. 15, 2018 (JP) ................................ 2018-214842
May 17, 2019 (JP) ................................ 2019-094029

(51) Int. Cl.
*H03K 17/687* (2006.01)
*H03K 17/10* (2006.01)
*H03K 17/66* (2006.01)

(52) U.S. Cl.
CPC ......... *H03K 17/687* (2013.01); *H03K 17/102* (2013.01); *H03K 17/66* (2013.01)

(58) Field of Classification Search
CPC ....................................... H03K 19/0175–0185
See application file for complete search history.

(56) References Cited

U.S. PATENT DOCUMENTS

| | | | | |
|---|---|---|---|---|
| 6,611,154 B2* | 8/2003 | Grasso | ............. | H03K 19/00361 326/31 |
| 7,227,400 B1* | 6/2007 | Gillespie | .......... | H03K 19/00315 327/333 |
| 7,323,912 B2* | 1/2008 | Nielsen | ................ | H03K 17/063 326/83 |
| 7,372,314 B2* | 5/2008 | Hirano | .................. | H03K 3/012 326/81 |
| 7,719,325 B1* | 5/2010 | Wang | .................. | H03K 17/162 326/87 |
| 7,893,730 B2* | 2/2011 | Jung | .............. | H03K 19/018521 327/108 |
| 8,723,552 B2* | 5/2014 | Tseng | ............. | H03K 19/018507 323/282 |
| 8,933,714 B2* | 1/2015 | Akahane | ................ | H03K 17/56 324/705 |
| 8,975,944 B2* | 3/2015 | Akahane | .......... | H03K 3/356182 326/62 |
| 9,595,967 B2* | 3/2017 | Goto | ............. | H03K 19/018514 |
| 9,722,610 B2* | 8/2017 | Akahane | ................ | H03K 3/012 |
| 9,966,944 B2* | 5/2018 | Rossi | ............... | H03K 17/04123 |
| 10,116,297 B1* | 10/2018 | Wu | ................ | H03K 19/017509 |

* cited by examiner

Primary Examiner — Thomas J. Hiltunen
(74) Attorney, Agent, or Firm — Cantor Colburn LLP

(57) ABSTRACT

A driving circuit for an N-channel or NPN-type high-side transistor includes: a level shift circuit configured to level-shift an input signal; and a buffer configured to drive the N-channel or NPN-type high-side transistor according to an output of the level shift circuit, wherein the level shift circuit includes: a differential conversion circuit of an open drain type configured to convert the input signal into a differential signal; a latch circuit configured to perform a state transition with a differential output of the differential conversion circuit as a trigger; and an assist circuit configured to inject an assist current into the latch circuit in synchronization with the input signal.

17 Claims, 12 Drawing Sheets

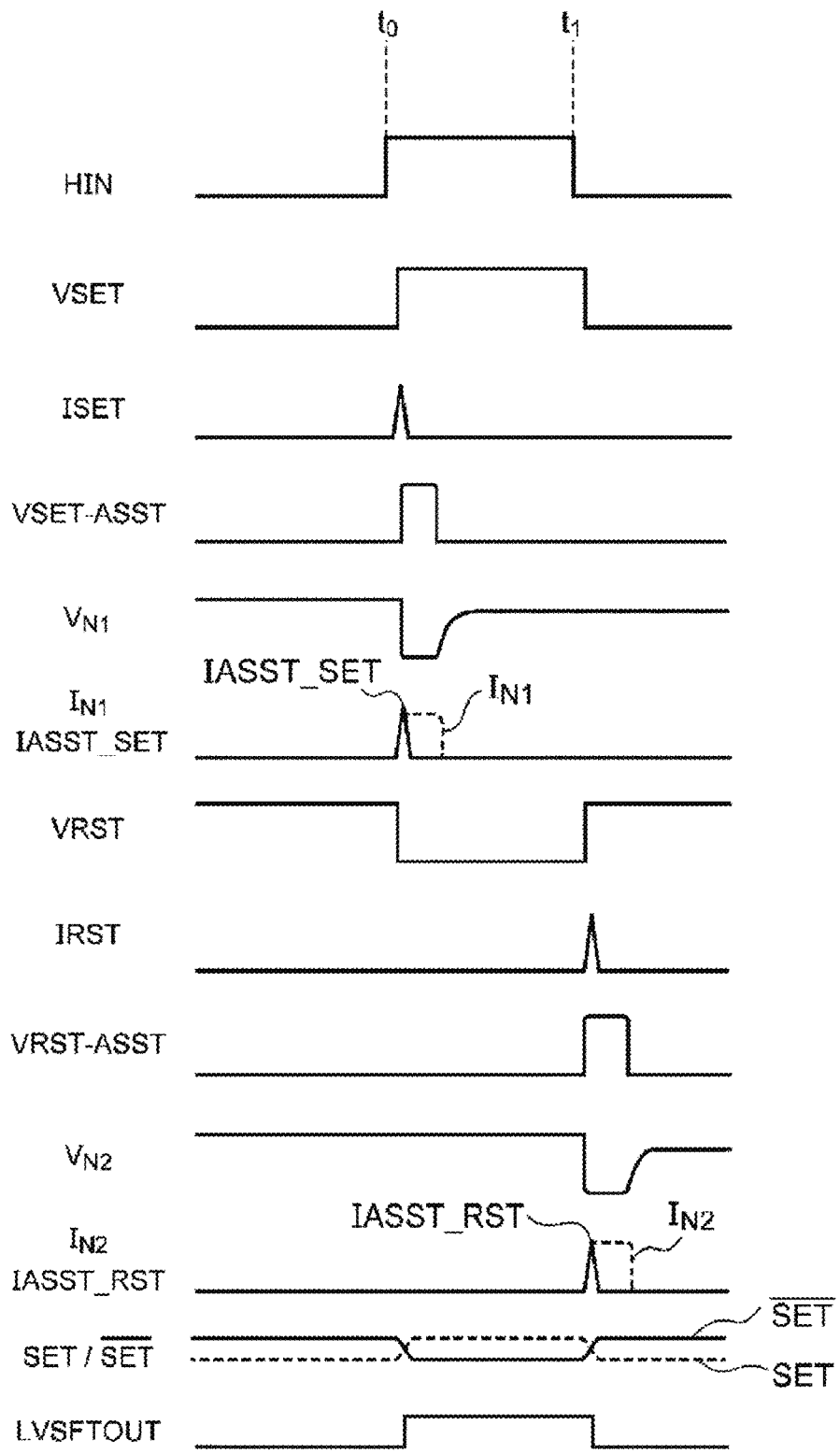

US 10,833,672 B2

DRIVING CIRCUIT FOR HIGH-SIDE TRANSISTOR, SWITCHING CIRCUIT, AND CONTROLLER FOR DC/DC CONVERTER

CROSS-REFERENCE TO RELATED APPLICATIONS

The present invention claims priority under 35 U.S.C. § 119 to Japanese Patent Application No. 2018-214842, filed on Nov. 15, 2018, and Japanese Patent Application No. 2019-094029, filed on May 17, 2019, the entire contents of which are incorporated herein by reference.

TECHNICAL FIELD

The present disclosure relates to a driving circuit for a high-side transistor.

BACKGROUND

In various applications such as a DC/DC converter, a power converter, a motor driving circuit and the like, a switching circuit including a power transistor and its driving circuit (a gate driving circuit) is used.

FIG. 1 is a circuit diagram of a switching circuit. A switching circuit 100R includes a high-side transistor MH, a low-side transistor ML, a high-side driving circuit 200R, and a low-side driving circuit 110.

The high-side transistor MH is installed between an input terminal (or input line) IN and a switching terminal (or switching line) VS, and the low-side transistor ML is installed between the switching terminal VS and a ground terminal GND. The high-side driving circuit 200R drives the high-side transistor MH according to a control input HIN, and the low-side driving circuit 110 drives the low-side transistor ML according to a control input LIN.

When the high-side transistor MH is turned on and the low-side transistor ML is turned off, an input voltage VIN is generated at the switching terminal VS. When the high-side transistor MH is turned off and the low-side transistor ML is turned on, a ground voltage VGND (0 V) is generated at the switching terminal VS. During a period when both the high-side transistor MH and the low-side transistor ML are turned off, an impedance of the switching terminal VS becomes high. The switching circuit 100R supplies power to a load (not shown) by switching these three states.

An N-type (N-channel) transistor may be used as the high-side transistor MH. In order to turn on the high-side transistor MH and maintain the on state, a voltage exceeding a gate threshold value VGS (th) of an FET is required to be applied between its gate and source. When the high-side transistor MH is turned on, a voltage $V_S$ of the switching line VS, i.e., a source voltage of the high-side transistor MH, is substantially equal to the input voltage VIN. Therefore, in order to maintain the on state of the high-side transistor MH, a gate signal higher than VIN+VGS (th) is required to be applied to the gate of the high-side transistor MH.

A bootstrap circuit is installed to generate the gate signal higher than the input voltage VIN. The bootstrap circuit includes a bootstrap capacitor C1 and a rectifying element D1. The bootstrap capacitor C1 is installed between a bootstrap terminal (or bootstrap line) VB and the switching terminal VS. A DC voltage VREG (>VGS (th)) is applied to the bootstrap terminal VB via the rectifying element D1.

When the switching voltage $V_S$ is low (0 V), the capacitor C1 is charged via the rectifying element D1 and a voltage between both ends thereof becomes ΔV=VREG−Vf where Vf denotes a voltage drop of the rectifying element D1. When the switching voltage $V_S$ rises, a voltage VB of the bootstrap terminal VB rises while maintaining VB=VS+ΔV. A potential difference between the VB terminal and the VS terminal is kept at ΔV by the bootstrap circuit.

The high-side driving circuit 200R includes a buffer (driver) 210 and a level shift circuit 220. The voltage VB is supplied to an upper power supply terminal of the buffer 210 and the voltage $V_S$ is supplied to a lower power supply terminal thereof. The buffer 210 supplies a gate voltage with VB as a high level and VS as a low level to the gate of the high-side transistor MH.

The level shift circuit 220 converts a binary control signal HIN of a logic level (VDD–0 V) into a binary intermediate signal HIN' of VB–VS.

FIG. 2 is a circuit diagram of the high-side driving circuit 200R. The level shift circuit 220 includes a pulse generator 222, inverters 224, 226, 228, and 230, and a logic circuit 232.

The pulse generator 222 detects a positive edge and a negative edge of the control signal HIN to generate a first edge signal Ep and a second edge signal En. The first inverter 224 receives a first edge signal Ep to output an inverted set signal \SET (where \ indicates logic inversion and is indicated by a bar in the drawing). The second inverter 226 receives a second edge signal En to output an inverted reset signal \RST.

The inverters 228 and 230 invert the inverted set signal \SET and the inverted reset signal \RST to generate a set signal SET and a reset signal RST. The logic circuit 232 generates a control pulse Sp having an on level according to the set signal SET and an off level according to the reset signal RST.

As a result of reviewing the high-side driving circuit 200R in FIG. 2, the present inventor recognized the following problems.

In an application where the input voltage VIN exceeds several tens of volts to 100 V, a high breakdown voltage is required for transistors constituting the first inverter 224 and the second inverter 226. High breakdown voltage transistors have parasitic capacitances Cp1 and Cp2 that cannot be ignored between their respective drains and sources, between their respective drains and gates, and between their respective drains and a substrate. When delays occur in the inverted set signal \SET and the inverted reset signal \RST due to the parasitic capacitances Cp1 and Cp2, the correct set signal SET and reset signal RST cannot be transmitted to the logic circuit 232, thereby becoming a cause of malfunction.

In order to address such a problem, an approach of masking the simultaneous generation of the set signal SET and the reset signal RST is considered for the logic circuit 232. However, if such an approach is adopted, when the reset signal RST is generated during a switching transition (for example, during the turn-on operation of the high-side transistor MH and before completion of the turn-on operation), it leads to a problem that the reset signal RST is masked and the high-side transistor MH may not be immediately turned off.

SUMMARY

Some embodiments of the present disclosure provide a driving circuit capable of accurately driving a high-side transistor.

According to one embodiment of the present disclosure, there is provided a driving circuit for an N-channel or NPN-type high-side transistor. The driving circuit includes: a level shift circuit configured to level-shift an input signal; and a buffer configured to drive the N-channel or NPN-type high-side transistor according to an output of the level shift circuit, wherein the level shift circuit includes: a differential conversion circuit of an open drain type configured to convert the input signal into a differential signal; a latch circuit configured to perform a state transition with a differential output of the differential conversion circuit as a trigger; and an assist circuit configured to inject an assist current into the latch circuit in synchronization with the input signal.

Further, arbitrary combination of the foregoing components or substituting the components or the expressions of the present disclosure with each other among a method, an apparatus, a system, and the like is also effective as an embodiment of the present disclosure.

BRIEF DESCRIPTION OF DRAWINGS

FIG. 7 is an operation waveform diagram of the driving circuit in FIG. 5.

DETAILED DESCRIPTION

Outline of Embodiment

Figure 1:
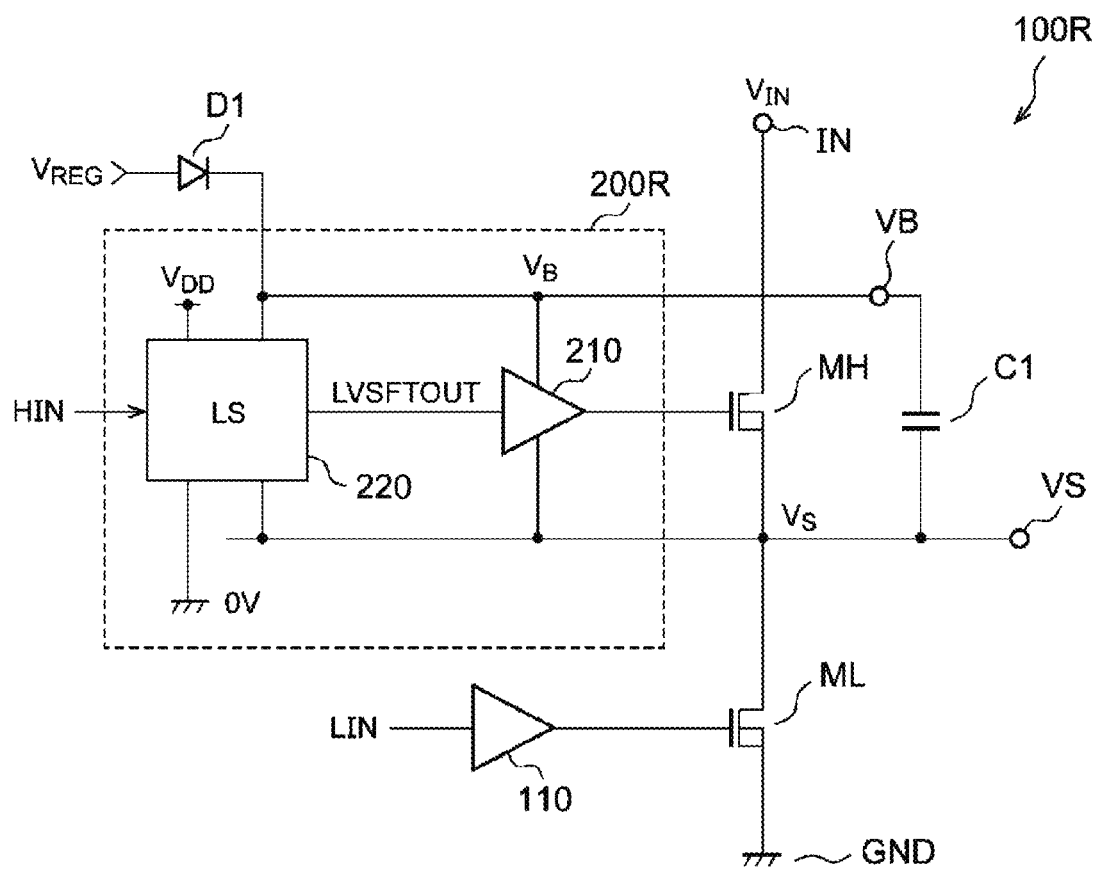
FIG. 1 is a circuit diagram of a switching circuit.
Figure 2:
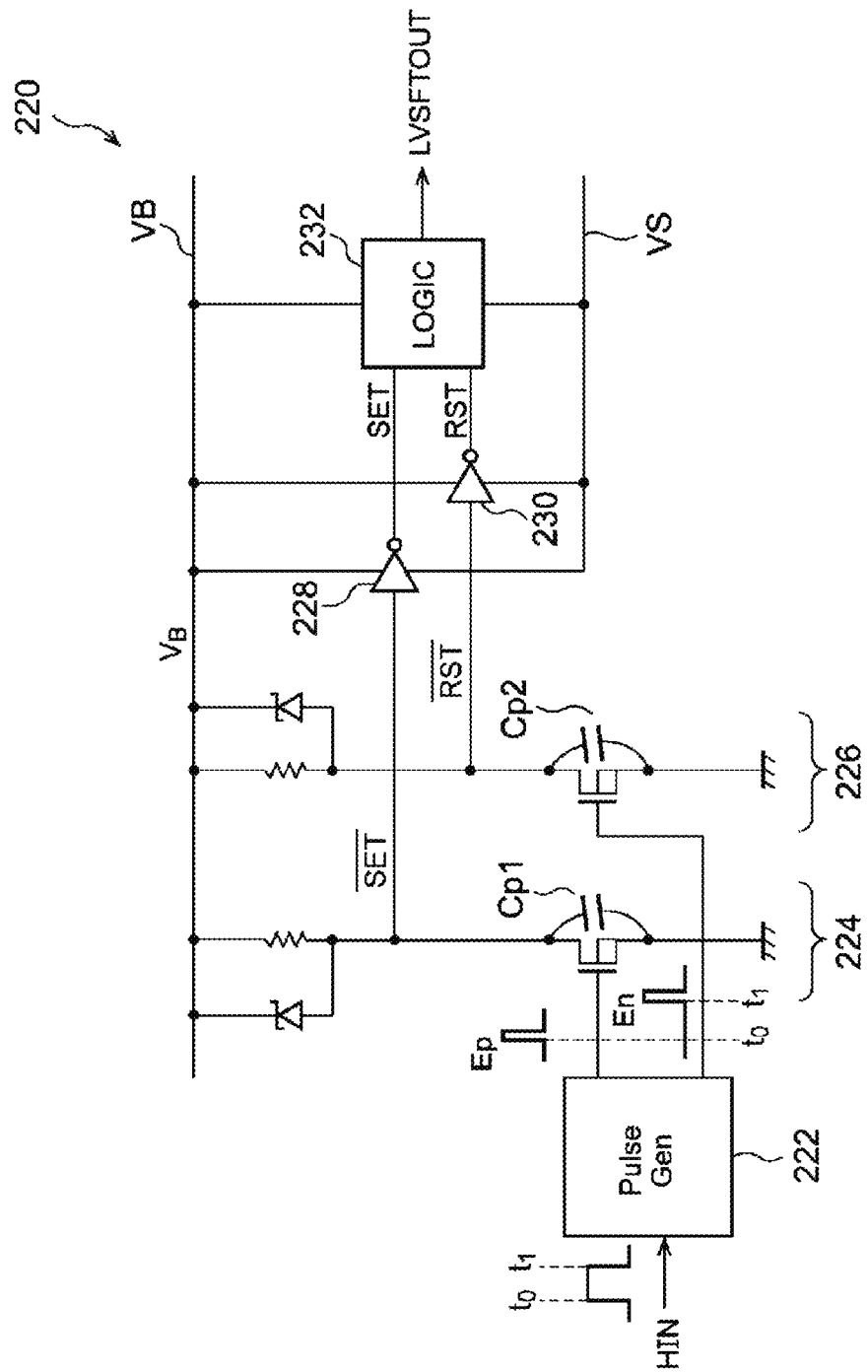
FIG. 2 is a circuit diagram of a high-side driving circuit.

An embodiment disclosed herein relates to a driving circuit for a high-side transistor. The driving circuit includes a level shift circuit for level-shifting an input signal, and a buffer for driving the high-side transistor according to an output of the level shift circuit. The level shift circuit includes a differential conversion circuit of an open drain type configured to convert the input signal into a differential signal, a latch circuit configured to perform a state transition with a differential output of the differential conversion circuit as a trigger, and an assist circuit configured to inject an assist current to the latch circuit in synchronization with the input signal.

By injecting the current by the assist circuit, the current caused by parasitic capacitances can be canceled. Thus, the state transition of the latch circuit can be accelerated, and the level shift circuit can transmit the input signal to the buffer at high speed.

The assist circuit may include a pulse generator configured to generate a first pulse signal asserted for a predetermined time from a positive edge of the input signal and a second pulse signal asserted for the a predetermined time from a negative edge of the input signal, an N-channel first transistor configured to receive the first pulse signal at its gate, a first current mirror circuit connected to a bootstrap line and configured to turn back a current of the first transistor, an N-channel second transistor configured to receive the second pulse signal at its gate, and a second current mirror circuit connected to the boot strap line and configured to turn back a current of the second transistor.

The assist circuit may further include a high breakdown voltage third transistor inserted between the first transistor and the first current mirror circuit, and a high breakdown voltage fourth transistor inserted between the second transistor and the second current mirror circuit.

The first transistor and the second transistor are high breakdown voltage transistors, and may be directly connected to the first current mirror circuit and the second current mirror circuit.

The assist circuit may further include a first diode installed between an input node of the first current mirror circuit and the switching line, and a second diode installed between an input node of the second current mirror circuit and the switching line.

The differential conversion circuit may include a logic circuit configured to generate complementary first and second signals according to the input signal, a high breakdown voltage N-channel fifth transistor configured to receive the first signal at its gate, and a high breakdown voltage N-channel sixth transistor configured to receive the second signal at its gate.

The differential conversion circuit may include a logic circuit configured to generate complementary first and second signals according to the input signal, an N-channel fifth transistor configured to receive the first signal at its gate, an N-channel sixth transistor configured to receive the second signal at its gate, a high breakdown voltage N-channel seventh transistor whose source is connected to a drain of the fifth transistor and whose drain is connected to the latch circuit, and a high breakdown voltage N-channel eighth transistor whose source is connected to a drain of the sixth transistor and whose drain is connected to the latch circuit.

The latch circuit may include P-channel ninth and tenth transistors whose sources are each connected to the bootstrap line and whose gates and drains are each cross-coupled, a high breakdown voltage eleventh transistor whose gate is connected to the switching line and whose source is connected to a drain of the ninth transistor, and a high breakdown voltage twelfth transistor whose gate is connected to the switching line and whose source is connected to a drain of the tenth transistor.

The driving circuit may further include a resistor installed between the switching line and a gate of each of the eleventh transistor and the twelfth transistor.

Embodiment

The present disclosure will now be described with reference to the drawings based on an exemplary embodiment. Like or equivalent components, members, and processes illustrated in each drawing are given like reference numerals and a repeated description thereof will be appropriately omitted. Further, the embodiment is presented by way of example only, and is not intended to limit the present disclosure, and any feature or combination thereof described in the embodiment may not necessarily be essential to the present disclosure.

In the present disclosure, "a state where a member A is connected to a member B" includes a case where the member A and the member B are physically directly connected or even a case where the member A and the member B are indirectly connected through any other member that does not substantially affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not substantially affect an electrical connection state between the member A and the member C or the member B and the member C or does not impair functions and effects achieved by combinations of the member A and the member C or the member B and the member C, in addition to a case where the member A and the member C or the member B and the member C are directly connected.

Further, the expression "signal A (voltage or current) corresponds to signal B (voltage or current)" may mean that signal A is correlated with signal B. Specifically, the expression may mean that (i) signal A is equal to signal B, (ii) signal A is proportional to signal B, (iii) signal A is obtained by level-shifting signal B, (iv) signal A is obtained by amplifying signal B, or (v) signal A is obtained by inverting signal B, (vi) any combination thereof, or the like. It is to be understood by those skilled in the art that a range of "corresponds to" is determined according to types and applications of signals A and B.

Figure 3:
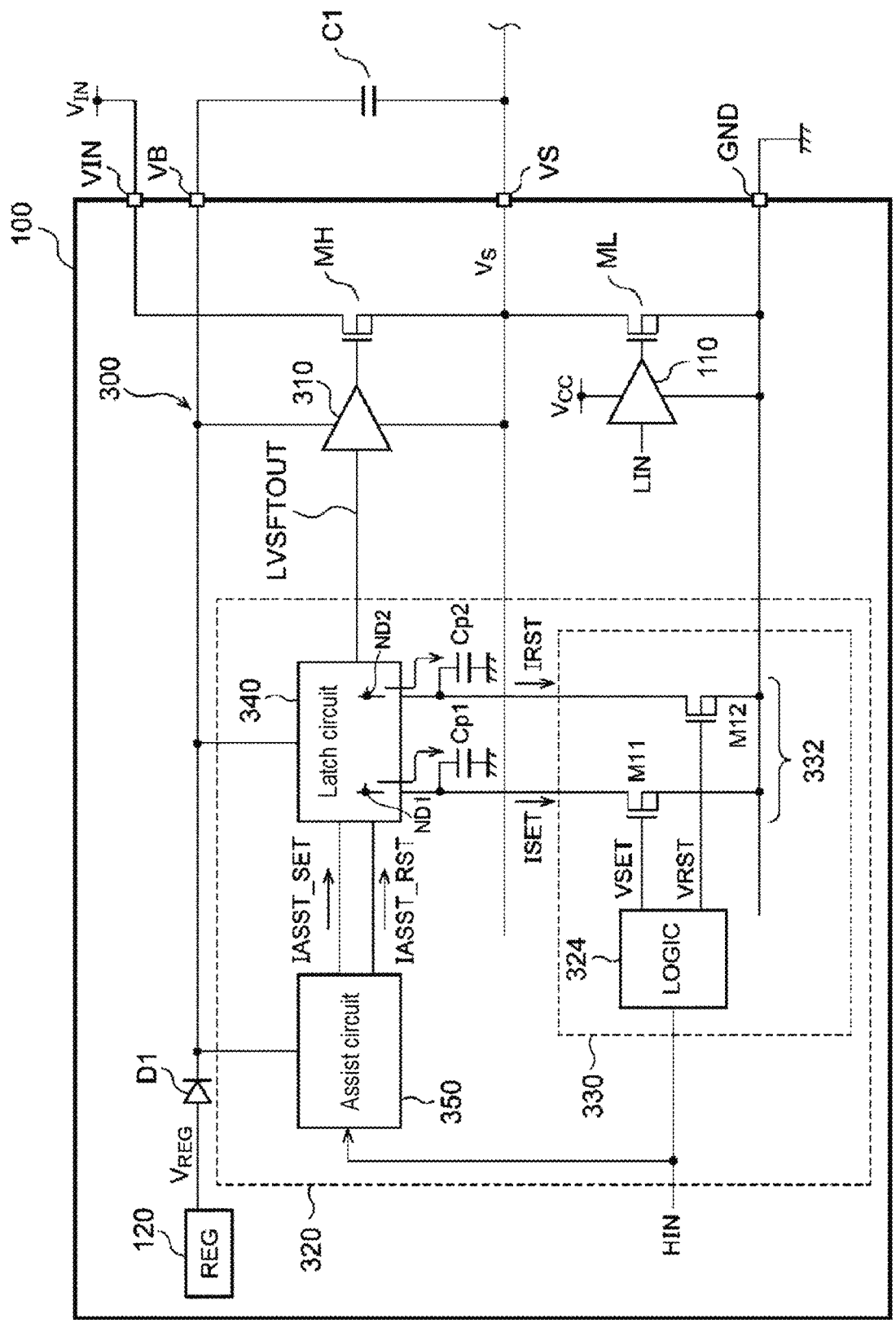
FIG. 3 is a circuit diagram of a switching circuit according to an embodiment of the present disclosure.

FIG. 3 is a circuit diagram of a switching circuit 100 according to an embodiment of the present disclosure. The switching circuit 100 includes an input (VIN) pin, a bootstrap (VB) pin, a switching (VS) pin, and a ground (GND) pin. In the following description, the pins will also be referred to as terminals or lines.

The switching circuit 100 includes a high-side transistor MH, a low-side transistor ML, a high-side driving circuit 300, and a low-side driving circuit 110, and is an integrated circuit (IC) in which they are integrated on a semiconductor chip.

The high-side transistor MH is an N-channel or NPN-type transistor, and is installed between the VIN pin and the VS pin. The low-side transistor ML is of the same type as the high-side transistor MH, and is installed between the VS pin and the GND pin. As in FIG. 1, the switching circuit 100 generates a high level voltage (VB) higher than the input voltage VIN on the bootstrap line VB by a so-called bootstrap circuit. A regulator 120 generates a stabilized internal voltage VREG and charges a bootstrap capacitor C1 via a diode D1. When a DC voltage stabilized at an appropriate voltage level is supplied from an external power supply to the switching circuit 100, the regulator 120 may be omitted.

The low-side driving circuit 110 drives the low-side transistor ML based on a control signal LIN.

The high-side driving circuit 300 drives the high-side transistor MH based on a control signal HIN. The high-side driving circuit (hereinafter, also simply referred to as a driving circuit) 300 includes a buffer (driver) 310 and a level shift circuit 320.

The level shift circuit 320 converts the input signal HEN of a logic level with the voltage at the GND pin as a low level and the power supply voltage VCC as a high level into an intermediate signal LVSFTOUT with the voltage VB of the bootstrap line VB as a high level and the voltage $V_S$ of the switching line VS as a low level. The buffer 310 drives the high-side transistor MH according to the output LVSFTOUT of the level shift circuit 320.

The level shift circuit 320 includes a differential conversion circuit 330, a latch circuit 340, and an assist circuit 350. The differential conversion circuit 330 includes a logic circuit 334 configured to convert the input signal HIN into differential signals VSET and VRST, and an output stage 332 of an open drain type (including an open collector). When the VSET signal, which is one (a positive phase signal) of the differential signals becomes high, one transistor M11 of the output stage 332 is turned on, and when the VRST signal, which is the other (a reverse phase signal) of the differential signals, becomes high, the other transistor M12 of the output stage 332 is turned on.

Figure 5:
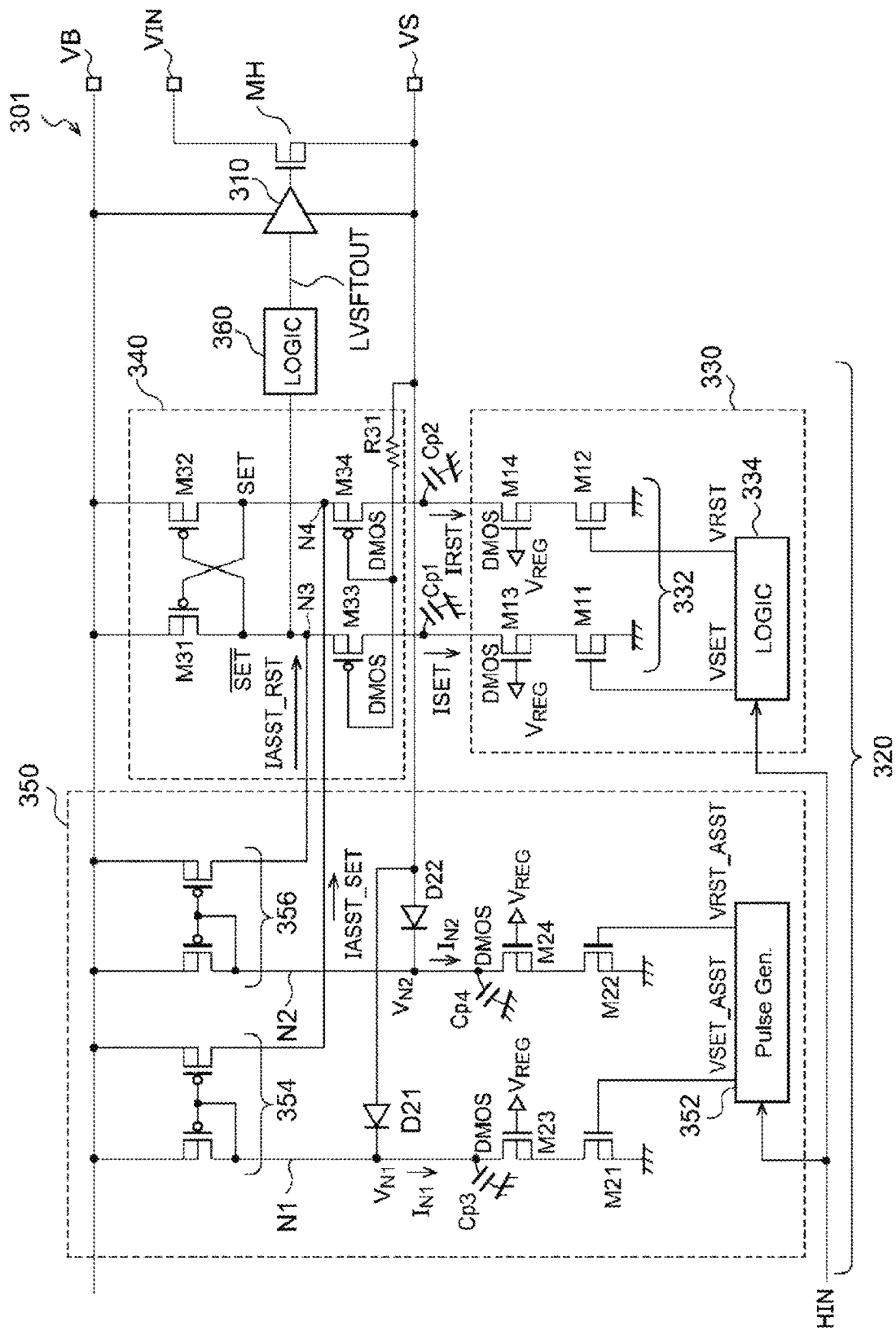
FIG. 5 is a circuit diagram of a driving circuit according to a first example of the present disclosure.

The latch circuit 340 performs a state transition with differential outputs ISET and IRST (indicated as current signals) of the differential conversion circuit 330 as a trigger. According to a circuit format of the latch circuit 340, a logic circuit 360 may be added at a subsequent stage of the latch circuit 340 as illustrated in FIG. 5.

Parasitic capacitances Cp1 and Cp2 are indicated in FIG. 3. This schematically indicates the parasitic capacitances of the transistors constituting the output stage 332 of the differential conversion circuit 330 and the internal parasitic capacitance of the latch circuit 340.

The assist circuit 350 accelerates the state transition by injecting assist currents IASST_SET and IASST_RST into the latch circuit 340 in synchronization with the input signal HIN. In FIG. 3, the latch circuit 340 is indicated as a black box, and a configuration thereof is not particularly limited. A node into which the assist currents IASST_SET and IASST_RST are injected may be determined according to the circuit format of the latch circuit 340 so as to accelerate the transition of the latch circuit 340.

Figure 4:
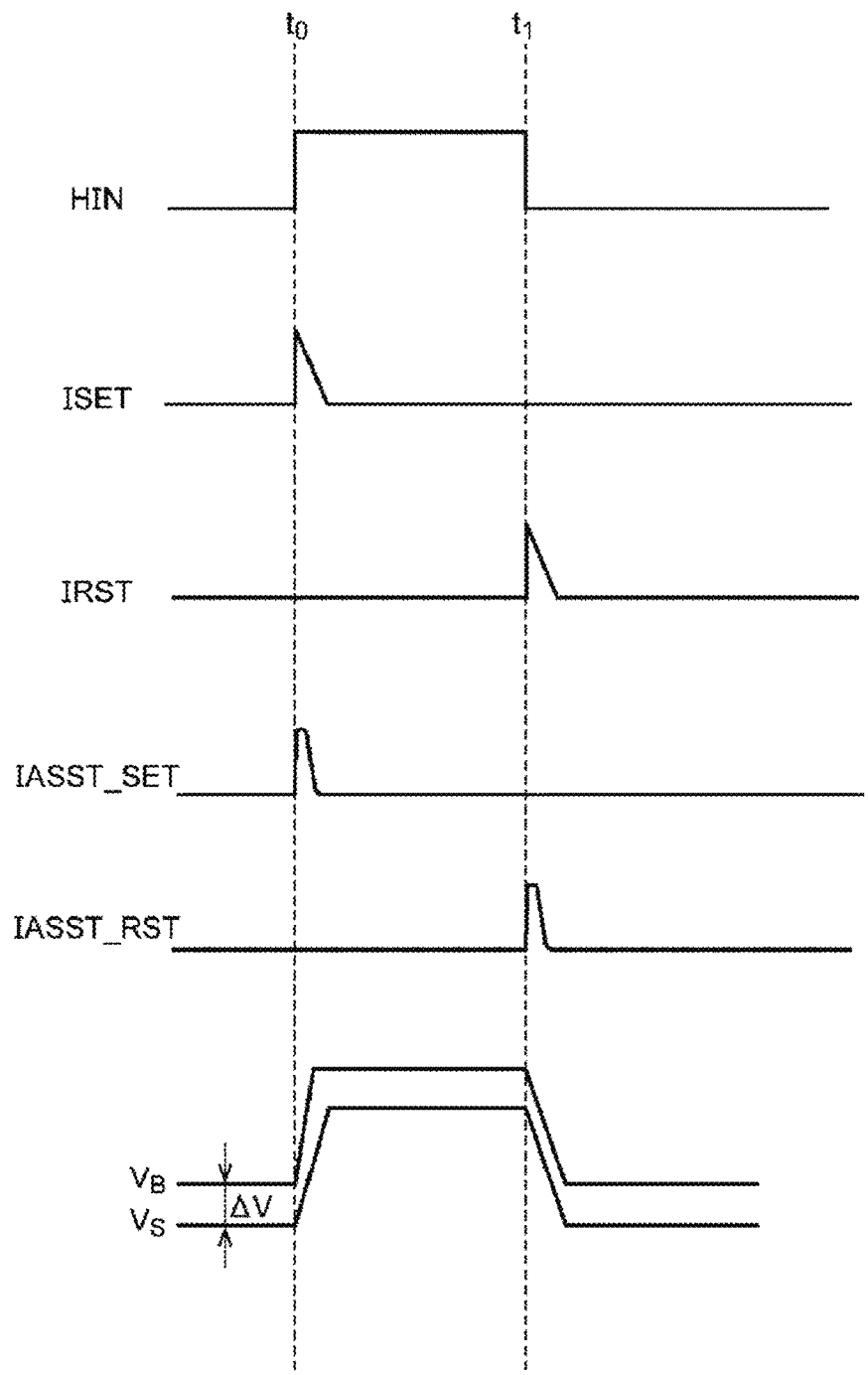
FIG. 4 is an operation waveform diagram of a driving circuit in FIG. 3.

The configuration of the driving circuit 300 has been described above. Next, an operation thereof will be described. FIG. 4 is an operation waveform diagram of the driving circuit 300 in FIG. 3. The input signal HIN transitions from the low level to the high level at time $t_0$ and from the high level to the low level at time $t_1$. The high level of the input signal HIN corresponds to the on state of the high-side transistor MH, and the low level of the input signal HIN corresponds to the off state of the high-side transistor MH.

Since the input signal HIN is at the low level before the time $t_0$, the high-side transistor MH is turned off and the potential VS of the switching line VS is at the low level.

When the input signal HIN transitions to the high level at the time $t_0$, the differential conversion circuit 330 sinks the current ISET as a trigger of a set state from the latch circuit 340. By the set current ISET, a potential of a first internal node ND1 of the latch circuit 340 is pulled to the low level, the latch circuit 340 starts to transition toward the set state, and the LVSFTOUT signal starts to transition to the high level. Thereafter, when the high-side transistor MH is turned on, the potential VS of the switching line VS rises and the voltage VB of the bootstrap line VB also rises.

In order to maintain the latch circuit 340 in the set state, the potential of a second internal node ND2 complementary to the first internal node ND1 must be higher than the potential of the first internal node ND1. However, the parasitic capacitance Cp2 prevents the potential of the second internal node ND2 from rising.

The assist circuit 350 generates the assist current IASST_SET in response to a positive edge of the input signal HIN. The assist current IASST_SET is supplied to the second internal node ND2 and the parasitic capacitance Cp2 side.

Since the assist current IASST_SET acts such that the potential of the second internal node ND2 rises, the influence of the parasitic capacitance Cp2 can be canceled, and thus the latch circuit 340 can quickly transition to the set state based on the set current ISET.

When the input signal HIN transitions to the low level at the time $t_1$, the differential conversion circuit 330 sinks the current IRST as a trigger of a reset state from the latch circuit 340. By the reset current IRST, the potential of the second internal node ND2 of the latch circuit 340 is pulled to the low level, the latch circuit 340 starts to transition toward the reset state, and the LVSFTOUT signal starts to transition to the low level. Thereafter, when the high-side transistor MH is turned off, the potential VS of the switching line VS drops and the voltage VB of the bootstrap line VB also drops.

In order to maintain the latch circuit 340 in the reset state, the potential of the first internal node ND1 must be higher than the potential of the second internal node ND2. However, the parasitic capacitance Cp1 prevents the potential of the first internal node ND1 from rising.

The assist circuit 350 generates the assist current IASST_RST in response to a negative edge of the input signal HIN. The assist current IASST_RST is supplied to the first internal node ND1 and the parasitic capacitance Cp1 side. Since the assist current IASST_RST acts such that the potential of the first internal node ND1 rises, the influence of the parasitic capacitance Cp1 can be canceled, and thus the latch circuit 340 can quickly transition to the reset state based on the reset current IRST.

The operation of the driving circuit 300 has been described above. According to this driving circuit 300, the assist currents IASST_SET and IASST_RST synchronized with the input signal HIN can be generated by the assist circuit 350 to cancel the influence of the parasitic capacitances Cp1 and Cp2. Thus, the state transition of the latch circuit 340 can be accelerated, and the level shift circuit 320 can transmit the input signal HIN to the buffer 310 at high speed.

The present disclosure is understood by the block diagram or the circuit diagram of FIG. 3 or intended to cover various devices and methods derived from the aforementioned description, but is not limited to the specific configuration. Hereinafter, more specific configuration examples or examples of embodiments will be described in order to help understand and clarify the essence or operation of the present disclosure, rather than to narrow the scope of the present disclosure.

Example 1

FIG. 5 is a circuit diagram of a driving circuit 301 according to a first example of the present disclosure.

The assist circuit 350 includes a pulse generator 352, a first transistor M21 to a fourth transistor M24, a first current mirror circuit 354, and a second current mirror circuit 356. The pulse generator 352 generates a first pulse signal (hereinafter, a VSET_ASST signal) asserted (e.g., a high level) for a predetermined time τ from the positive edge of the input signal HIN and a second pulse signal (hereinafter, referred to as a VRST_ASST signal) asserted for the predetermined time τ from the negative edge of the input signal HIN.

A combination of the first current mirror circuit 354 and the first transistor M21 may also be understood as a first current source which can be switched to be turned on and off according to the VSET_ASST signal, and similarly, a combination of the second current mirror circuit 356 and the second transistors M22 may be understood as a second current source which can be switched to be turned on and off according to the VRST_ASST signal. Therefore, the first current mirror circuit 354 and the second current mirror circuit 356 may be replaced by a current source having another configuration.

The latch circuit 340 includes a ninth transistor M31 to a twelfth transistor M34. The ninth transistor M31 and the tenth transistor M32 are P-channel MOSFETs whose sources are connected to the bootstrap line VB and whose gates and drains are cross-coupled.

The eleventh transistor M33 and the twelfth transistor M34 are P-channel high breakdown voltage elements whose gates are connected to the switching line VS and biased by the voltage $V_S$. The source of the eleventh transistor M33 is connected to the drain of the ninth transistor M31. The gate of the twelfth transistor M34 is connected to the drain of the tenth transistor M32.

A resistor R31 is installed between the switching line VS and the respective gates of the eleventh transistor M33 and the twelfth transistor M34. Destruction of the gates of the transistors M33 and M34 can be prevented by the resistor R31.

The logic circuit 360 receives complementary output signals SET and \SET from the latch circuit 340 to generate an intermediate signal LVSFTOUT. In FIG. 5, only one output Q of the latch circuit 340 is drawn, but two outputs SET and \SET may be applied to the logic circuit 360.

The N-channel first transistor M21 receives the VSET_ASST signal at its gate. The first current mirror circuit 354 is connected to the bootstrap line VB, and turns back the current IN1 of the first transistor M21 to generate an IASST_SET signal. An output node of the first current mirror circuit 354 is connected to the drain of the tenth transistor M32 of the latch circuit 340.

The N-channel second transistor M22 receives the VRST_ASST signal at its gate. The second current mirror circuit 356 is connected to the bootstrap line VB, and turns back the current IN2 of the second transistor M22 to generate an IASST_RST signal. An output node of the second current mirror circuit 356 is connected to the drain of the ninth transistor M31.

The third transistor M23 and the fourth transistor M24 are high breakdown voltage transistors, and are inserted between the first transistor M21 and the first current mirror circuit 354 and between the second transistor M22 and the second current mirror circuit 356. A constant voltage VREG is applied to the gates of the third transistor M23 and the fourth transistor M24 to be appropriately biased.

As the high breakdown voltage elements, a transistor having a double-diffused MOS (DMOS) structure may be used in some embodiments, but a transistor having another structure, for example, a high voltage MOSFET (HVMOS), a lateral diffusion MOSFET (LDMOS), an insulated gate bipolar transistor (IGBT), a silicon carbide (SiC)-JFET, SIC-MOSFET, or the like, may be used in some embodiments. In particular, other transistors which are not specified as the high breakdown voltage elements are MOSFETs having a normal breakdown voltage.

A first diode D21 is installed between the input node N1 of the first current mirror circuit 354 and the switching line VS. The first diode D21 can clamp the potential of the node N1 with VS−Vf as a lower limit, and can prevent an overvoltage from being applied to the first current mirror circuit 354. A second diode D22 is installed between the input node N2 of the second current mirror circuit 356 and the switching line VS. The second diode D22 can clamp the potential of the node N2 with VS−Vf as the lower limit, and can prevent an overvoltage from being applied to the second current mirror circuit 356.

Next, the differential conversion circuit 330 will be described. The differential conversion circuit 330 includes an output stage 332 of an open drain type, and a logic circuit 334.

The logic circuit 334 generates complementary first signal VSET and second signal VRST according to the input signal HIN. For example, VSET has the same logic as HIN, and VRST has an inverted logic of HIN.

The output stage 332 includes a fifth transistor M11 to an eighth transistor M14. A source of the N-channel fifth transistor M11 is grounded, and the fifth transistor M11 receives the first signal VSET at its gate. A source of the N-channel sixth transistor M12 is grounded, and the transistor M12 receives the second signal VRST at its gate.

The N-channel seventh transistor M13 is a high breakdown voltage element with its source connected to a drain of the fifth transistor M11, and its drain is connected to one internal node N3 (corresponding to the first internal node ND1 in FIG. 3) of the latch circuit 340. The N-channel eighth transistor M14 is a high breakdown voltage element with its source connected to a drain of the sixth transistor M12 and its drain is connected to the other internal node N4 (second internal node ND2 in FIG. 3) of the latch circuit 340. A constant voltage VREG is applied to gates of the seventh transistor M13 and the eighth transistor M14 to be appropriately biased.

Figure 6A:
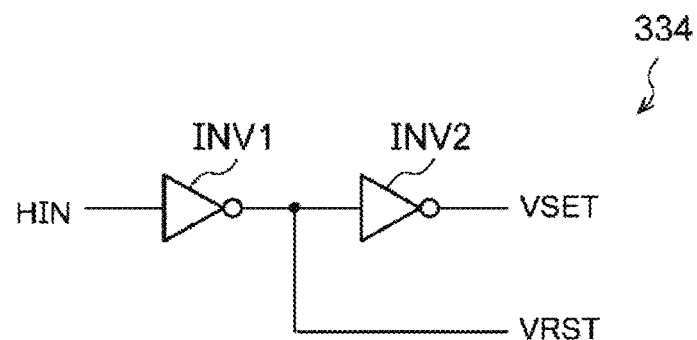
FIG. 6A is a circuit diagram illustrating a configuration example of a logic circuit.
Figure 6B:
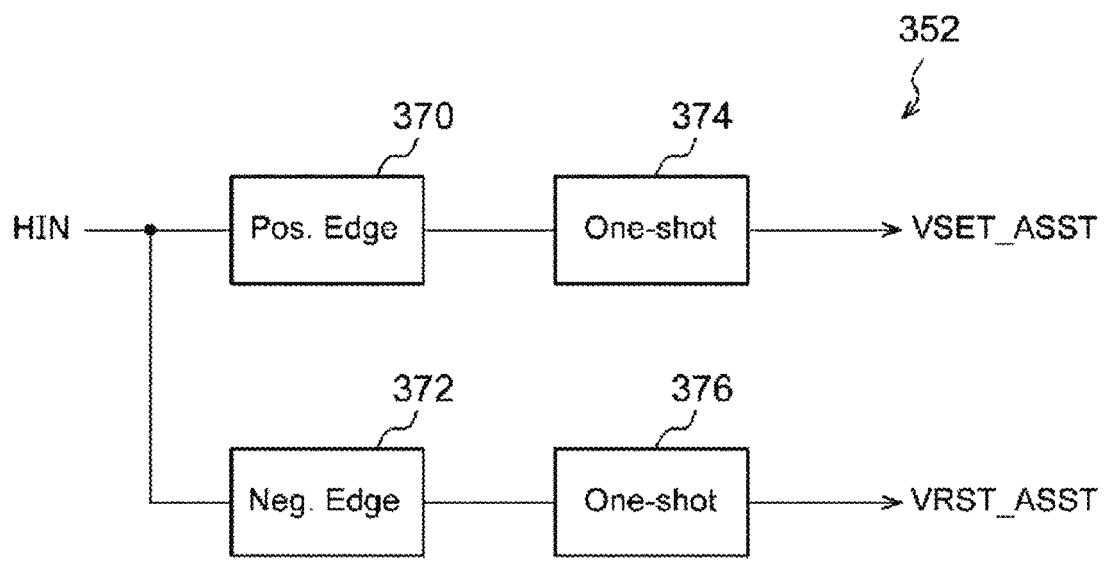
FIG. 6B is a circuit diagram illustrating a configuration example of a pulse generator.

FIG. 6A is a circuit diagram illustrating a configuration example of the logic circuit 334, and FIG. 6B is a circuit diagram illustrating a configuration example of the pulse generator 352.

Reference is made to FIG. 6A. For example, the logic circuit 334 may be configured by two inverters INV1 and INV2. Furthermore, the configuration of the logic circuit 334 is not limited to that in FIG. 6A, and various modifications having the same function may be considered by those skilled in the art.

Reference is made to FIG. 6B. The pulse generator 352 includes edge detection circuits 370 and 372, and one-shot circuits 374 and 376. Each of the edge detection circuits 370 and 372 detects a positive edge and a negative edge of the input signal HIN. In response to an output (positive edge detection signal) of the edge detection circuit 370, the one-shot circuit 374 generates a VSET_ASST signal to be at a high level for the predetermined time τ. In response to an output (negative edge detection signal) of the edge detection circuit 372, the one-shot circuit 376 generates a VRST_ASST signal to be at a high level for the predetermined time τ.

The configuration of the driving circuit 301 has been described above. Next, an operation thereof will be described. FIG. 7 is an operation waveform diagram of the driving circuit 301 in FIG. 5.

The input signal HIN transitions from the low level to the high level at the time $t_0$. The VSET signal is in phase with the HIN signal, and the VRST signal is in reverse phase with the HIN signal. When the VSET signal transitions to the high level at the time $t_0$, the fifth transistor M11 is turned on to allow the current ISET to flow. The current ISET is a trigger for setting the latch circuit 340. When the current ISET flows, the potential of the drain of the ninth transistor M31 (the node N3, the first internal node ND1 in FIG. 3) drops to allow the latch circuit 340 to operate in the set state.

When the HIN signal transitions to the high level at the time $t_0$, the VSET_ASST signal transitions to the high level for the predetermined time τ. Therefore, the current IN1 flows through the first transistor M21 and the assist current IASST_SET is output from the first current mirror circuit 354. The assist current IASST_SET raises the potential of the drain (node N4) of the tenth transistor M32, and thus can assist the transition of the latch circuit 340 to the set state.

The input signal HIN transitions from the high level to the low level at the time $t_1$. The VRST signal, which is in reverse phase with the HIN signal, transitions from the low level to the high level at the time $t_1$. When the VRST signal becomes high, the sixth transistor M12 is turned on to allow the current IRST to flow. The current IRST is a trigger for resetting the latch circuit 340. When the current IRST flows, the potential of the drain (node N4) of the tenth transistor M32 drops to allow the latch circuit 340 to operate in the reset state.

When the HIN signal transitions to the low level at the time $t_1$, the VRST_ASST signal transitions to the high level for the predetermined time τ. Therefore, the current IN2 flows through the second transistor M22 and the assist current IASST_RST is output from the second current mirror circuit 356. The assist current IASST_RST raises the potential of the drain (node N3) of the ninth transistor M31, and thus can assist the transition of the latch circuit 340 to the reset state.

The active assist operation based on the VSET_ASST signal and VRST_ASST signal generated by the pulse generator 352 has been described above. The assist circuit 350 can perform a passive assist operation, which will be described below, in addition to the active assist operation.

Normally, the potential VS of the switching line VS is switched according to the control signal HIN, but the potential VS of the switching line VS may vary due to the influence of disturbance. When the voltage $V_S$ of the switching line VS rises due to disturbance, the voltage VB of the bootstrap line VB also rises. At this time, the potentials of the nodes N3 and N4 of the latch circuit 340 also need to be raised following the voltage VB of the bootstrap line VB. The assist circuit 250 assists in raising the potentials of the nodes N3 and N4.

When the voltage $V_S$ of the VS line rises, charging currents IN1 and IN2 flow for charging the parasitic capacitances Cp3 and Cp4 of the transistors M23 and M24, which are DMOS transistors. The charging currents IN1 and IN2 are copied by the current mirror circuits 354 and 356, and the assist currents IASST_SET and IASST_RST are supplied to the nodes N3 and N4. Thus, the potentials of the nodes N3 and N4 of the latch circuit 240 can be rapidly raised following the rise of the voltage VB of the bootstrap line VB. The passive assist operation has been described above.

Next, the logic circuit 360 will be described.

Figure 8:
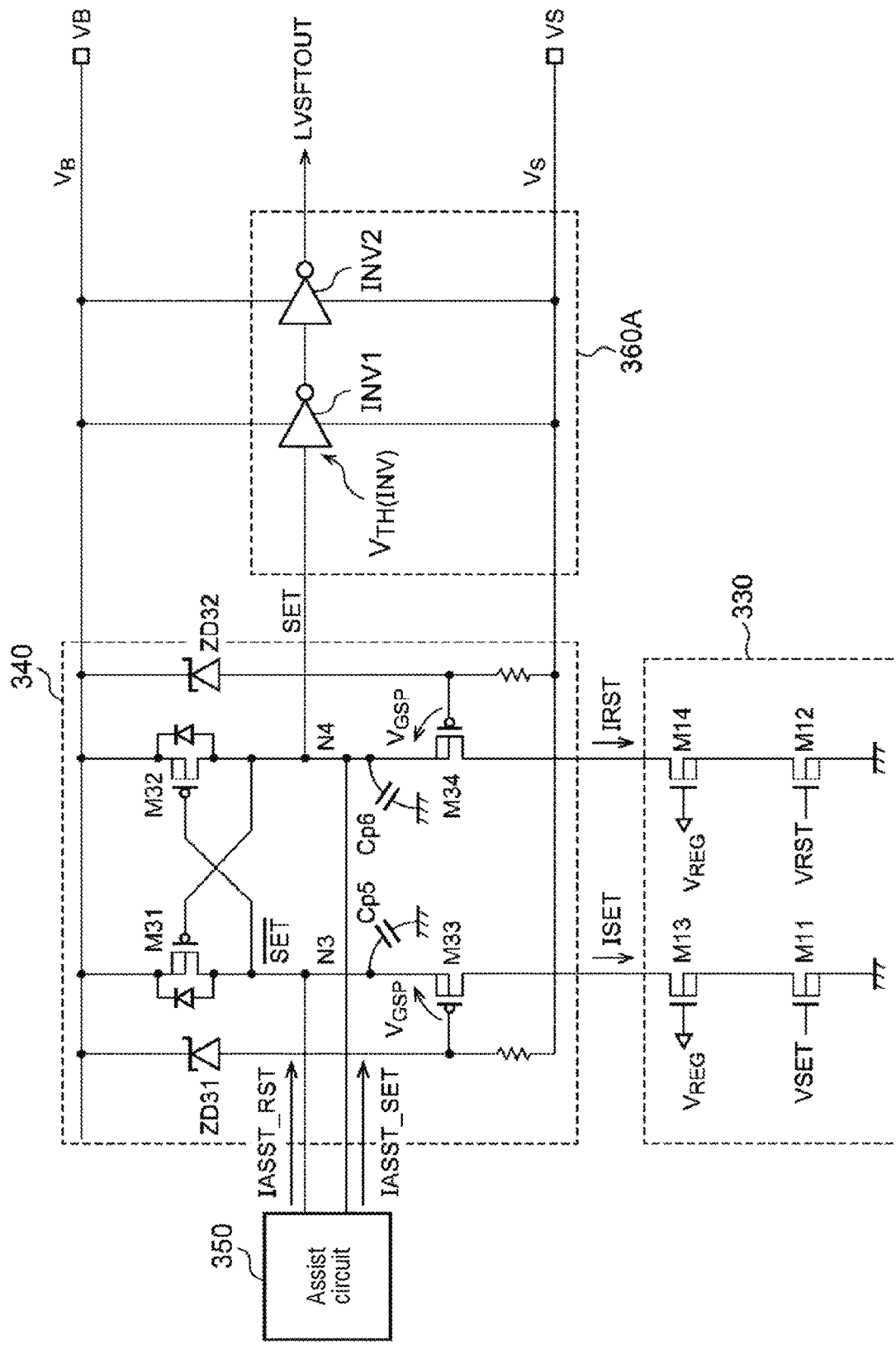
FIG. 8 is a circuit diagram illustrating a first configuration example of the logic circuit.

FIG. 8 is a circuit diagram illustrating a first configuration example (360A) of the logic circuit 360. The logic circuit 360A includes inverters INV1 and INV2. The set signal SET is output as the LVSFTOUT signal via the inverters INV1 and INV2 of two stages. Alternatively, the inverter INV2 is omitted, and the inverted set signal \SET may be input to the inverter INV1 of the first stage.

For the latch circuit 340, when gate breakdown voltages of the transistors M33 and M34 are low, Zener diodes ZD31 and ZD32 may be installed. The Zener diode ZD31 is installed between the gate of the transistor M33 and the bootstrap line VB, and the Zener diode ZD32 is installed between the gate of the transistor M34 and the bootstrap line VB. In this case, the set signal SET and the inverted set signal \SET swing with VB as a high level and VB−VZ+

VGSP as a low level, respectively, where VZ denotes a Zener voltage of the Zener diodes ZD31 and ZD32.

The logic circuit 360A functions as a level shifter that converts the set signal SET, which sets VB to the high level and VB−VZ+VGSP to the low level, into the output LVSFTOUT, which sets VB to the high level and VS to the low level.

Next, two situations that may occur in the logic circuit 360A of FIG. 8 will be described.

An input threshold value VTH (INV) of the logic circuit 360A including the inverters is an intermediate point between VB and VS. Therefore, when the switching voltage $V_S$ swings to a negative voltage, the threshold value VTH (INV) decreases accordingly. When the threshold value VTH (INV) decreases below the low level (VB−VZ+VGSP) of the input of the logic circuit 360A, the state transition of the latch circuit 340 is not reflected in the LVSFTOUT signal. That is, the switching may be stopped. This is the first situation.

The voltage VB of the bootstrap line VB varies at high speed following the switching voltage $V_S$. As described above, the parasitic capacitances Cp5 and Cp6 exist at the nodes N3 and N4, and electric charges are stored therein. When the voltage VB drops at high speed, the potentials of the nodes N3 and N4 tend to drop accordingly. To this end, the electric charges need to be discharged from the parasitic capacitors Cp5 and Cp6. The electric charges flow into the bootstrap line VB via body diodes of the transistors M31 and M32. As a result, the potentials of the nodes N3 and N4 jump to VB+VF. If the SET signal is at the low level (VB−VZ−VGSP) and the voltage VB rapidly drops, since the SET signal jumps to VB+VF and exceeds the threshold value of the logic circuit 360A of the subsequent stage, the LVSFTOUT signal transitions to the high level, causing a malfunction. This is the second problem.

Figure 9:
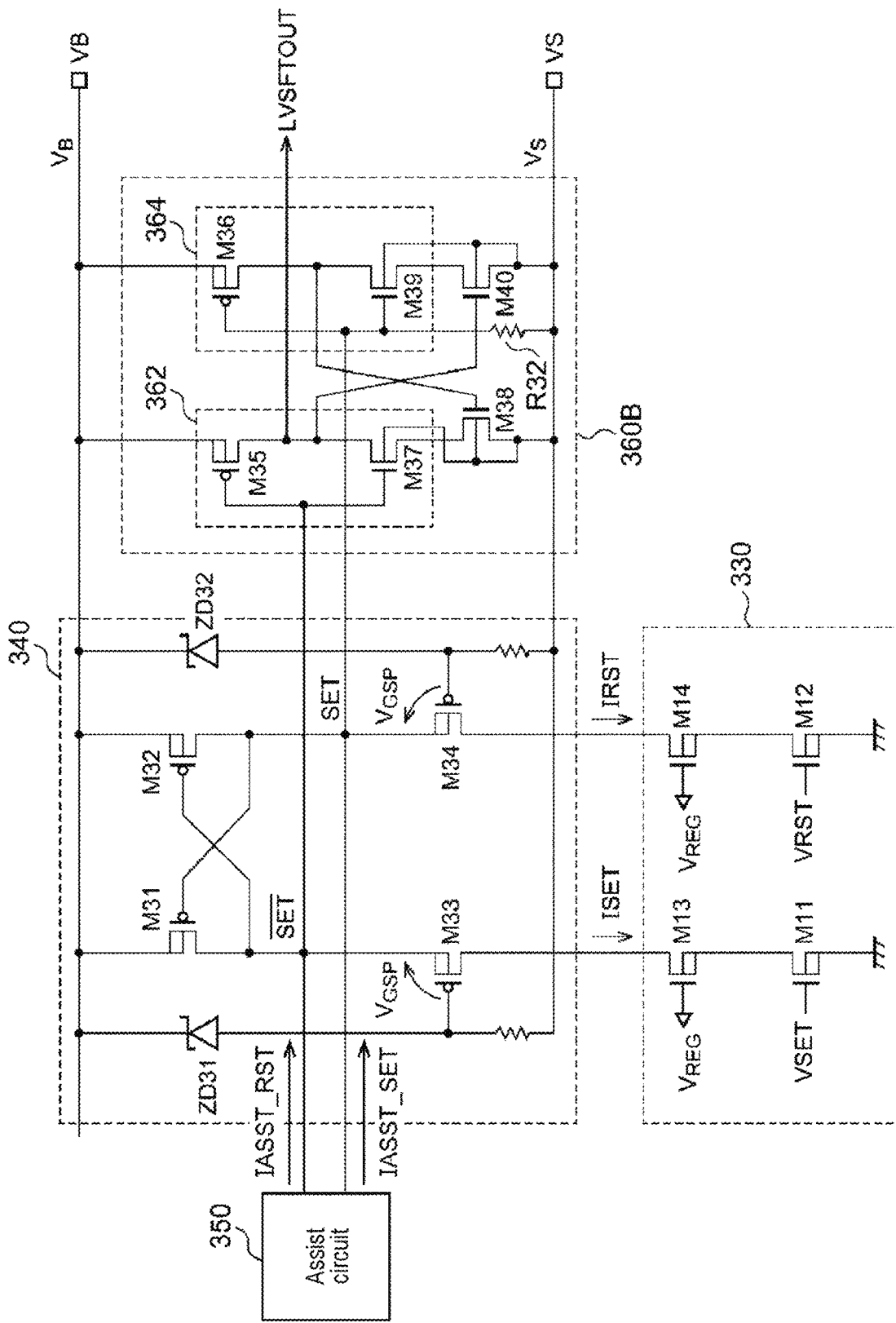
FIG. 9 is a circuit diagram illustrating a second configuration example of the logic circuit.

The first and second situations are solved by the following second configuration example. FIG. 9 is a circuit diagram illustrating a second configuration example (360B) of the logic circuit 360. The logic circuit 360 includes a thirteenth transistor M35 to an eighteenth transistor M40, and a resistor R32. The thirteenth transistor M35 and the fourteenth transistor M36 are PMOS transistors, and the fifteenth transistor M36 and the eighteenth transistor M40 are NMOS transistors. The transistors M35 and M37 form a CMOS inverter 362, and the transistors M36 and M39 form a CMOS inverter 364. The inverted set signal \SET from the latch circuit 340 is supplied to an input of the CMOS inverter 362 whose output is connected to a gate of the transistor M40.

The set signal SET from the latch circuit 340 is supplied to an input of the CMOS inverter 364, and the gate of the transistor M38 is connected to an output of the CMOS inverter 364. The resistor R32 is installed to set the logic of the SET signal to the low level, i.e., to turn off the switching transistor, when the output of the latch circuit 340 becomes indefinite (high impedance).

The configuration of the logic circuit 360B has been described above. Next, an operation thereof will be described. The logic circuit 360B functions as a level shifter which converts the set signal SET and the inverted set signal \SET that set VB to the high level and set VB−VZ+VGSP to the low level into the output LVSFTOUT that sets VB to the high level and VS to the low level. Furthermore, the logic circuit 360B operates as a latch circuit whose state transitions according to the set signal SET and the inverted set signal \SET. That is, the logic circuit 360B may be recognized as a level shifter/latch circuit.

The logic circuit 360B can address the situations that occur in the logic circuit 360A of FIG. 8. The reason will be described below.

At first glance, the logic circuit 360B in FIG. 9 may be seen to have an inverter input, but has a PMOS input with the voltage VB as a reference because the transistors M38 and M40 are inserted. That is, the threshold value VTH of the input of the logic circuit 360 is not the threshold value VTH (INV) (i.e., the intermediate point of VB and VS) of the configuration including the inverters but VTH=VB−VGS (th), where VGS (th) denotes a threshold voltage of the PMOS transistors M35 and M36.

Since the logic circuit 360B in FIG. 9 has the PMOS input instead of the inverter input, it has a constant threshold value VTH=VB−VGS (th) regardless of variation in the switching voltage $V_S$. Therefore, the low level (VB−VZ+VGSP) of the set signal SET (\SET) can be below the threshold value VTH, and the logic circuit 360B can reliably propagate the state of the latch circuit 340 to the subsequent circuit. That is, the first situation can be resolved.

In addition, the logic circuit 360B is robust against a sudden drop in the voltage VB of the bootstrap line VB. It is assumed that the SET signal is at the high level and the \SET signal is at the low level in an initial state before the voltage VB is varied. At this time, the LVSFTOUT signal is at the high level, a relatively high gate voltage is applied to the transistor M40, and a relatively low gate voltage is applied to the transistor M38. Therefore, the impedance of the transistor M38 is higher than the impedance of the transistor M40.

It is assumed that the voltage VB has suddenly dropped from the initial state. Then, as described above, the SET signal and the \SET signal jump to VB+VF, and both PMOS transistors M35 and M36 are turned off.

A pair of transistors M37 and M38 are considered as a first source follower and a pair of transistors M38 and M40 are considered as a second source follower. The same voltage VB+VF is input to the two source followers, but when focusing on the load impedance, the impedance of the transistor M38 is higher than the impedance of the transistor M40. Therefore, when comparing the potential of the drain of the transistor M37 and the potential of the drain of the transistor M39, since the potential of the drain of the transistor M37 becomes relatively higher, the LVSOUT signal can be kept at the high level. Furthermore, the impedance of the transistor M40 is further lowered by the high LVSFTOUT signal, and feedback is applied so that the LVSFTOUT signal is further inclined to the side of the high level.

It is assumed that the SET signal is at the low level and the \SET signal is at the high level in the initial state before the voltage VB is varied. At this time, the LVSFTOUT signal is at the low level, a relatively low gate voltage is applied to the transistor M40, and a relatively high gate voltage is applied to the transistor M38. Therefore, the impedance of the transistor M40 is higher than the impedance of the transistor M38.

It is assumed that the voltage VB has suddenly dropped from the initial state. Then, as described above, the SET signal and the \SET signal jump to VB+VF, and both PMOS transistors M35 and M36 are turned off.

In this case, when comparing the potential of the drain of the transistor M37 and the potential of the drain of the M39 in the two source followers, since the potential of the drain of the transistor M37 is relatively lower, the LVSOUT signal can be kept at the low level. Furthermore, the impedance of the transistor M40 become higher by the low LVSFTOUT signal, and feedback is applied so that the LVSFTOUT signal is further inclined to the side of the low level.

Example 2

Figure 10:
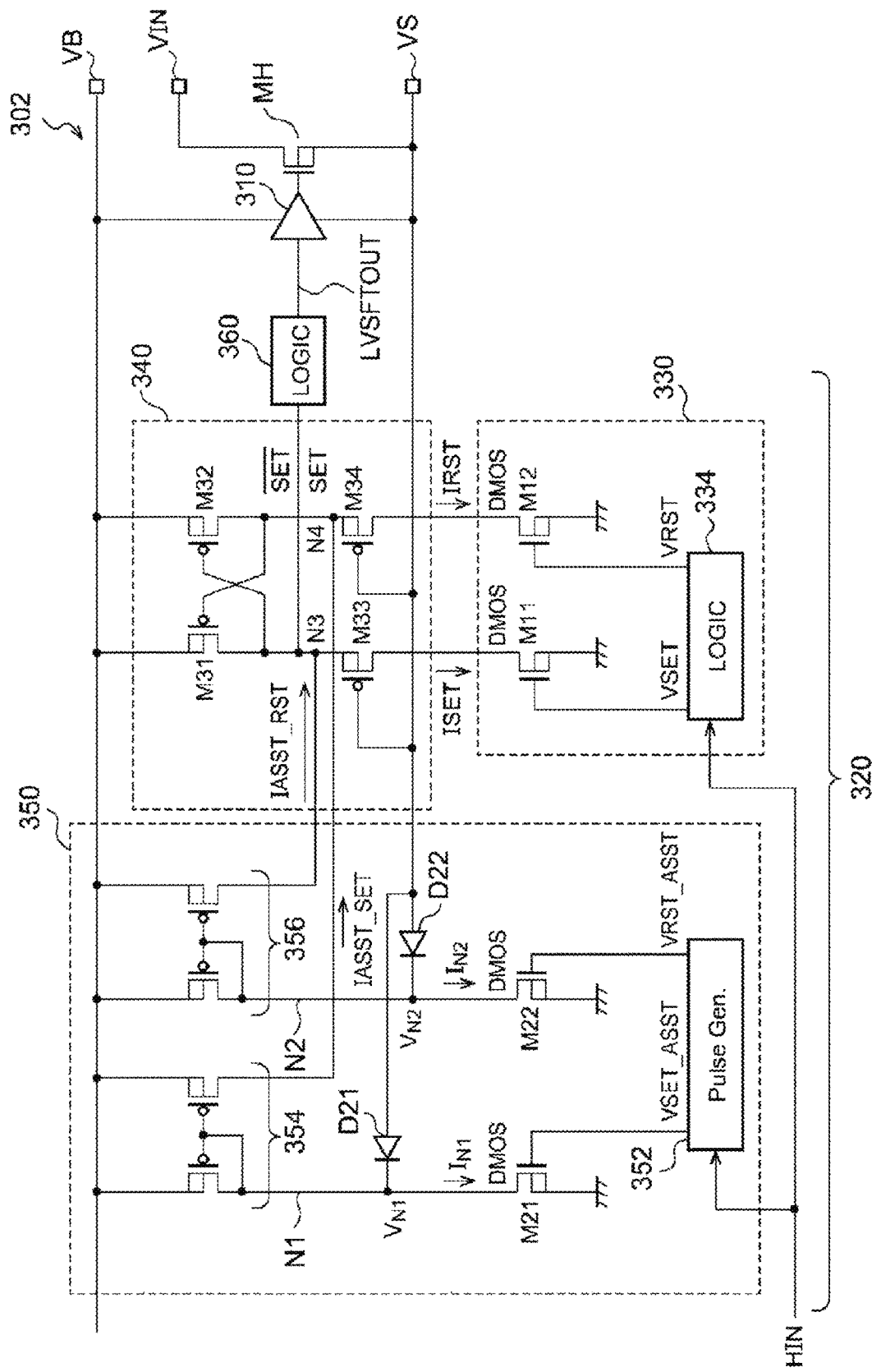
FIG. 10 is a circuit diagram of a driving circuit according to a second example of the present disclosure.

FIG. 10 is a circuit diagram of a driving circuit 302 according to a second example of the present disclosure. A difference between the driving circuit 302 and the driving circuit 301 in FIG. 5 will be described. In the differential conversion circuit 330 of FIG. 10, the transistors M13 and M14 are omitted from the driving circuit 301 in FIG. 5, and the transistors M11 and M12 are replaced by high breakdown voltage elements. Furthermore, in the assist circuit 350 of FIG. 10, the transistors M23 and M24 are omitted from the assist circuit 350 in FIG. 5, and the transistors M21 and M22 are replaced by high breakdown voltage elements.

The same effects as those of the driving circuit 301 in FIG. 5 can also be achieved by the driving circuit 302 in FIG. 10.

(Applications)

Figure 11:
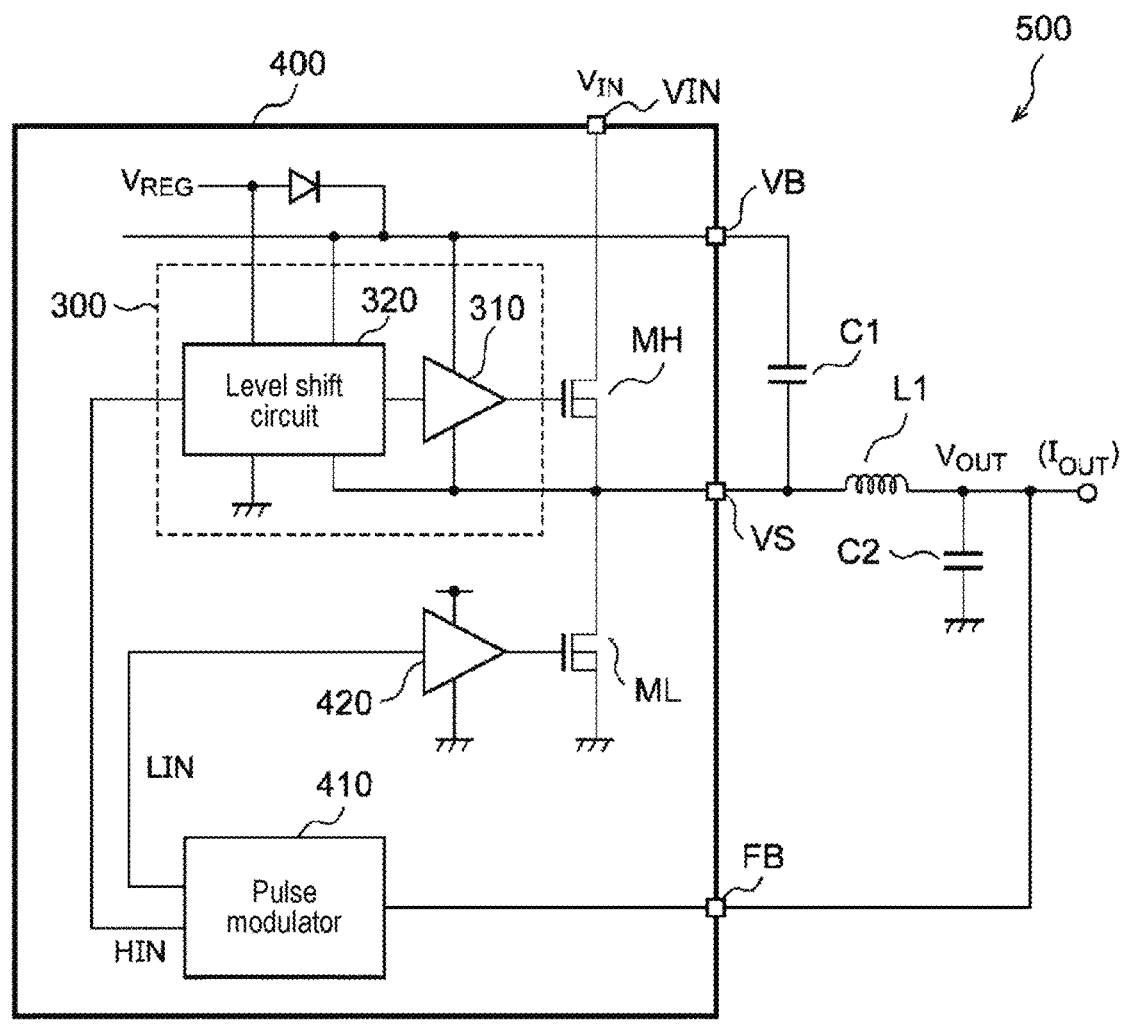
FIG. 11 is a circuit diagram of a controller for a DC/DC converter.

Next, applications of the driving circuit 300 (301 and 302) will be described. The driving circuit 300 may be used for a DC/DC converter. FIG. 11 is a circuit diagram of a controller 400 for a DC/DC converter 500. The DC/DC converter 500 is a synchronous rectification step-down (buck) converter, and includes capacitors C1 and C2 and an inductor L1, in addition to the controller 400.

The controller 400 includes a high-side transistor MH, a low-side transistor ML, a pulse modulator 410, a low-side driving circuit 420, and a driving circuit (high-side driving circuit) 300. The pulse modulator 410 generates pulse signals HIN and LIN so that an output (an output voltage, an output current or a load state) of the DC/DC converter 500 approaches a target value. For example, the pulse modulator 410 may make an output voltage VOUT close to a target voltage VREF (constant voltage control), or may make the output current IOUT close to a target current IREF (constant current control).

The high-side driving circuit 300 drives the N-channel or NPN-type high-side transistor MH based on the pulse signal HIN. The low-side driving circuit 420 drives the low-side transistor ML based on the pulse signal LIN.

Figure 12:
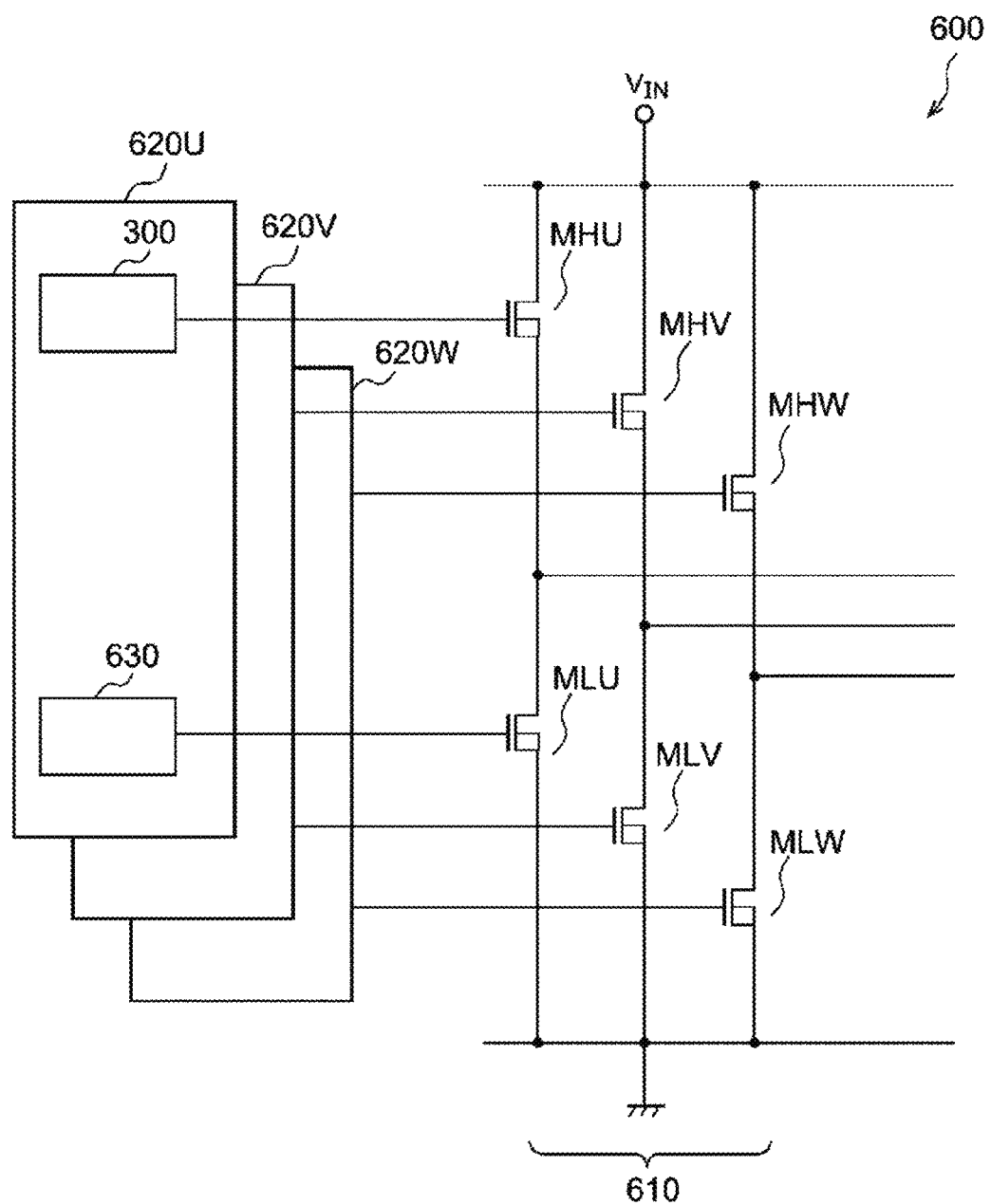
FIG. 12 is a circuit diagram of an inverter device including the driving circuit.

The driving circuit 300 may be used for an inverter device. FIG. 12 is a circuit diagram of an inverter device 600 including the driving circuit 300. The inverter device 600 includes a three-phase inverter 610, and driving circuits 620U, 620V, and 620W having U-phase, V-phase, and W-phase, respectively. The three-phase inverter 610 includes high-side transistors MHU, MHV, and MHW, and low-side transistors MLU, MLV, and MLW. A driving circuit 620# (where #=U, V, W) includes a high-side driving circuit 300 and a low-side driving circuit 630.

The present disclosure has been described above with reference to the embodiments. It is to be understood by those skilled in the art that the embodiments are merely illustrative and may be variously modified by any combination of the components or processes of the embodiments, and such modifications are also within the scope of the present disclosure. Hereinafter, the modifications will be described.

First Modification

In the above-described embodiments, the high-side transistor MH has been described as the N-channel MOSFET, but it may be an NPN-type bipolar transistor or an IGBT. In this case, the gate, the source, and the drain may be read as a base, an emitter, and a drain.

Second Modification

In the above-described embodiments, there has been described a case where the high-side transistor MH is integrated on the same IC as the driving circuit 300 but the present disclosure is not limited thereto. The high-side transistor MH may be a discrete component.

Third Modification

In the DC/DC converter 500 of FIG. 11, the low-side transistor ML may be replaced by a diode. Furthermore, the topology of the DC/DC converter 500 is not limited to the step-down type, and may be another type including a high-side transistor.

Fourth Modification

The application of the switching circuit 100 is not limited to the DC/DC converter or the inverter device. For example, the switching circuit 100 may be applied to a bidirectional converter, a battery charging circuit, and a class D amplifier for audio.

According to the present disclosure in some embodiments, it is possible to reliably drive a high-side transistor.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A driving circuit for an N-channel or NPN-type high-side transistor, the driving circuit comprising:
   a level shift circuit configured to level-shift an input signal; and
   a buffer configured to drive the N-channel or NPN-type high-side transistor according to an output of the level shift circuit,
   wherein the level shift circuit includes:
      a differential conversion circuit of an open drain type configured to convert the input signal into a differential signal; a latch circuit configured to perform a state transition with a differential output of the differential conversion circuit as a trigger; and an assist circuit configured to inject an assist current into the latch circuit in synchronization with the input signal, and
   wherein the assist circuit includes:
      a pulse generator configured to generate a first pulse signal asserted for a predetermined time from a positive edge of the input signal and a second pulse signal asserted for the predetermined time from a negative edge of the input signal;
      an N-channel first transistor configured to receive the first pulse signal at a gate of the N-channel first transistor;
      a first current mirror circuit connected to a bootstrap line and configured to turn back a current of the N-channel first transistor;

an N-channel second transistor configured to receive the second pulse signal at a gate of the N-channel second transistor; and a second current mirror circuit connected to the bootstrap line and configured to turn back a current of the N-channel second transistor.

2. The driving circuit of claim 1, wherein the assist circuit further includes:

a high breakdown voltage third transistor inserted between the N-channel first transistor and the first current mirror circuit; and a high breakdown voltage fourth transistor inserted between the N-channel second transistor and the second current mirror circuit.

3. The driving circuit of claim 1, wherein the N-channel first transistor and the N-channel second transistor are high breakdown voltage transistors, and are directly connected to the first current mirror circuit and the second current mirror circuit, respectively.

4. The driving circuit of claim 1, wherein the assist circuit further includes:

a first diode installed between an input node of the first current mirror circuit and a switching line; and a second diode installed between an input node of the second current mirror circuit and the switching line.

5. The driving circuit of claim 1, wherein the differential conversion circuit includes:

a logic circuit configured to generate complementary first and second signals according to the input signal;

a high breakdown voltage N-channel fifth transistor configured to receive the first signal at a gate of the high breakdown voltage N-channel fifth transistor; and a high breakdown voltage N-channel sixth transistor configured to receive the second signal at a gate of the high breakdown voltage N-channel sixth transistor.

6. The driving circuit of claim 1, wherein the differential conversion circuit includes:

a logic circuit configured to generate complementary first and second signals according to the input signal;

an N-channel fifth transistor configured to receive the first signal at a gate of the N-channel fifth transistor;

an N-channel sixth transistor configured to receive the second signal at a gate of the N-channel sixth transistor;

a high breakdown voltage N-channel seventh transistor whose source is connected to a drain of the N-channel fifth transistor and whose drain is connected to the latch circuit; and a high breakdown voltage N-channel eighth transistor whose source is connected to a drain of the N-channel sixth transistor and whose drain is connected to the latch circuit.

7. A switching circuit comprising:

a high-side transistor installed between an input line and a switching line;

a low-side transistor installed between the switching line and a ground line; and the driving circuit of claim 1 configured to drive the high-side transistor.

8. A driving circuit for an N-channel or NPN-type high-side transistor, the driving circuit comprising:

a level shift circuit configured to level-shift an input signal; and a buffer configured to drive the N-channel or NPN-type high-side transistor according to an output of the level shift circuit, wherein the level shift circuit includes:

a differential conversion circuit of an open drain type configured to convert the input signal into a differential signal; a latch circuit configured to perform a state transition with a differential output of the differential conversion circuit as a trigger; and an assist circuit configured to inject an assist current into the latch circuit in synchronization with the input signal, and wherein the latch circuit includes:

a P-channel ninth transistor and a P-channel tenth transistor whose sources are each connected to a bootstrap line and whose gates and drains are each cross-coupled;

a high breakdown voltage eleventh transistor whose gate is connected to a switching line and whose source is connected to the drain of the P-channel ninth transistor; and a high breakdown voltage twelfth transistor whose gate is connected to the switching line and whose source is connected to the drain of the P-channel tenth transistor.

9. The driving circuit of claim 8, further comprising a level shifter/latch circuit installed at a subsequent stage of the latch circuit, wherein the level shifter/latch circuit includes:

a P-channel thirteenth transistor whose source is connected to the bootstrap line and whose gate is connected to the drain of the P-channel ninth transistor;

a P-channel fourteenth transistor whose source is connected to the bootstrap line and whose gate is connected to the drain of the P-channel tenth transistor;

an N-channel fifteenth transistor whose drain is connected to a drain of the P-channel thirteenth transistor and whose gate is connected to the drain of the P-channel ninth transistor;

an N-channel sixteenth transistor whose drain is connected to a drain of the P-channel fourteenth transistor and whose gate is connected to the drain of the P-channel tenth transistor;

an N-channel seventeenth transistor whose drain is connected to a source of the N-channel fifteenth transistor, whose gate is connected to the drain of the P-channel fourteenth transistor, and whose source is connected to the switching line; and an N-channel eighteenth transistor whose drain is connected to a source of the N-channel sixteenth transistor, whose gate is connected to the drain of the P-channel thirteenth transistor, and whose source is connected to the switching line.

10. The driving circuit of claim 8, further comprising a resistor installed between the gate of each of the high breakdown voltage eleventh transistor and the high breakdown voltage twelfth transistor and the switching line.

11. A controller for a DC/DC converter, the controller comprising:

a pulse modulator configured to generate a pulse signal such that an output of the DC/DC converter approaches a target value; and a driving circuit configured to drive an N-channel or NPN-type high-side transistor based on the pulse signal, wherein the driving circuit includes:

a level shift circuit configured to level-shift the pulse signal; and a buffer configured to drive the N-channel or NPN-type high-side transistor according to an output of the level shift circuit, wherein the level shift circuit includes:

a differential conversion circuit of an open drain type configured to convert the pulse signal into a differential signal;

a latch circuit configured to perform a state transition with a differential output of the differential conversion circuit as a trigger; and an assist circuit configured to accelerate the state transition by injecting an assist current into the latch circuit in synchronization with the pulse signal, and wherein the assist circuit includes:

a pulse generator configured to generate a first pulse signal asserted for a predetermined time from a positive edge of an input signal and a second pulse signal asserted for the predetermined time from a negative edge of the input signal;

an N-channel first transistor configured to receive the first pulse signal at a gate of the N-channel first transistor;

a first current mirror circuit connected to a bootstrap line and configured to turn back a current of the N-channel first transistor;

an N-channel second transistor configured to receive the second pulse signal at a gate of the N-channel second transistor; and a second current mirror circuit connected to the bootstrap line and configured to turn back a current of the N-channel second transistor.

12. The controller of claim 11, wherein the assist circuit further includes:

a high breakdown voltage third transistor inserted between the N-channel first transistor and the first current mirror circuit; and a high breakdown voltage fourth transistor inserted between the N-channel second transistor and the second current mirror circuit.

13. The controller of claim 11, wherein the N-channel first transistor and the N-channel second transistor are high breakdown voltage transistors, and are directly connected to the first current mirror circuit and the second current mirror circuit, respectively.

14. The controller of claim 11, wherein the assist circuit further includes:

a first diode installed between an input node of the first current mirror circuit and a switching line; and a second diode installed between an input node of the second current mirror circuit and the switching line.

15. The controller of claim 11, wherein the differential conversion circuit includes:

a logic circuit configured to generate complementary first and second signals according to an input signal;

a high breakdown voltage N-channel fifth transistor configured to receive the first signal at a gate of the high breakdown voltage N-channel fifth transistor; and a high breakdown voltage N-channel sixth transistor configured to receive the second signal at a gate of the high breakdown voltage N-channel sixth transistor.

16. The controller of claim 11, wherein the differential conversion circuit includes:

a logic circuit configured to generate complementary first and second signals according to an input signal;

an N-channel fifth transistor configured to receive the first signal at a gate of the N-channel fifth transistor;

an N-channel sixth transistor configured to receive the second signal at a gate of the N-channel sixth transistor;

a high breakdown voltage N-channel seventh transistor whose source is connected to a drain of the N-channel fifth transistor and whose drain is connected to the latch circuit; and a high breakdown voltage N-channel eighth transistor whose source is connected to a drain of the N-channel sixth transistor and whose drain is connected to the latch circuit.

17. A controller for a DC/DC converter, the controller comprising:

a pulse modulator configured to generate a pulse signal such that an output of the DC/DC converter approaches a target value; and a driving circuit configured to drive an N-channel or NPN-type high-side transistor based on the pulse signal, wherein the driving circuit includes:

a level shift circuit configured to level-shift the pulse signal; and a buffer configured to drive the N-channel or NPN-type high-side transistor according to an output of the level shift circuit, wherein the level shift circuit includes:

a differential conversion circuit of an open drain type configured to convert the pulse signal into a differential signal;

a latch circuit configured to perform a state transition with a differential output of the differential conversion circuit as a trigger; and an assist circuit configured to accelerate the state transition by injecting an assist current into the latch circuit in synchronization with the pulse signal, and wherein the latch circuit includes:

a P-channel ninth transistor and a P-channel tenth transistor whose sources are each connected to a bootstrap line and whose gates and drains are each cross-coupled;

a high breakdown voltage eleventh transistor whose gate is connected to a switching line and whose source is connected to the drain of the P-channel ninth transistor; and a high breakdown voltage twelfth transistor whose gate is connected to the switching line and whose source is connected to the drain of the P-channel tenth transistor.

* * * * *